(12) United States Patent
Lee, Jr. et al.

(10) Patent No.: US 7,541,800 B2
(45) Date of Patent: Jun. 2, 2009

(54) METHODS AND SYSTEMS FOR DETECTING DC INFLUENCE IN A CURRENT SENSOR

(75) Inventors: Robert Edward Lee, Jr., Dover, NH (US); Donald Frank Bullock, Somersworth, NH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/778,463

(22) Filed: Jul. 16, 2007

(65) Prior Publication Data
US 2009/0021235 A1    Jan. 22, 2009

(51) Int. Cl.
*G01R 15/18* (2006.01)

(52) U.S. Cl. .................................................. 324/127

(58) Field of Classification Search ................ 324/126, 324/127, 117 R, 117 H
See application file for complete search history.

(56) References Cited

U.S. PATENT DOCUMENTS

| | | | |
|---|---|---|---|
| 4,217,546 A | 8/1980 | Milkovic | |
| 4,255,704 A | 3/1981 | Milkovic | |
| 4,278,940 A | 7/1981 | Milkovic | |
| 4,721,906 A * | 1/1988 | Ferguson et al. | 324/132 |
| 4,729,057 A * | 3/1988 | Halleck | 361/213 |
| 4,761,605 A | 8/1988 | Jochum | |
| 4,887,028 A | 12/1989 | Voisine et al. | |
| 4,970,459 A | 11/1990 | Germer et al. | |
| 5,307,008 A | 4/1994 | So | |
| 5,473,244 A * | 12/1995 | Libove et al. | 324/126 |
| 5,497,077 A * | 3/1996 | Nukui | 324/117 H |
| 6,429,785 B1 | 8/2002 | Griffin et al. | |
| 6,657,424 B1 | 12/2003 | Voisine et al. | |
| 2006/0028197 A1 | 2/2006 | Quiquempoix | |

FOREIGN PATENT DOCUMENTS

| | | |
|---|---|---|
| GB | 2231673 A1 | 11/1990 |
| GB | 2376360 A | 12/2002 |
| WO | 2008009903 A1 | 1/2008 |

OTHER PUBLICATIONS

Foreign Search Report Related to Application No. 08160409.2-1524 dated Dec. 4, 2008.

* cited by examiner

*Primary Examiner*—Ha Tran T Nguyen
*Assistant Examiner*—Arleen M Vazquez
(74) *Attorney, Agent, or Firm*—Armstrong Teasdale LLP

(57) ABSTRACT

Methods and systems for an electrical meter are provided. The meter includes a current sensor configured to be communicatively coupled to a conductor, and a processor communicatively coupled to the current sensor wherein the processor is configured to receive signals indicative of current flow through the conductor and wherein the processor is further configured to process the signals to determine an imbalance between the positive half cycle of the current flowing through the conductor and the negative half cycle of the current flowing through the conductor to detect a DC influence on the current sensor.

11 Claims, 4 Drawing Sheets

METHODS AND SYSTEMS FOR DETECTING DC INFLUENCE IN A CURRENT SENSOR

BACKGROUND

This invention relates generally to electrical metering, and more particularly to a method and apparatus for detecting DC influence in a metering current transformer.

At least some known metering systems are influenced in their metering capability by rectified DC loads that draw current through a meter monitoring the consumption of the load. The DC component of the current passing through the current sensor may not transmit through the current sensor, however the DC component may tend to saturate the core of the current sensor. Saturating the core can cause the meter to under-register the current flow and the revenue associated with the current. Some known meters use current transformers (CTs) that are immune or less susceptible to DC influences, however such CTs are relatively more expensive, are larger and tend to have a large phase shift with temperature changes.

SUMMARY

In one embodiment, an electrical meter includes a current sensor configured to be communicatively coupled to a conductor, and a processor communicatively coupled to the current sensor wherein the processor is configured to receive signals indicative of current flow through the conductor and wherein the processor is further configured to process the signals to determine an imbalance between the positive half cycle of the current flowing through the conductor and the negative half cycle of the current flowing through the conductor.

In yet another embodiment, a method of detecting a DC influence of a current sensor includes summing squared sample values of a total RMS current from the sensor over a predetermined period of time, summing squared sample values of at least one of an RMS current of a positive half cycle and an RMS current of a negative half cycle over the predetermined period of time, and determining an imbalance of the RMS current of the positive half cycle and the RMS current of the negative half cycle using at least two of the summed squares of the total RMS current, the RMS current of the positive half cycle, and the RMS current of the negative half cycle.

In another embodiment, a metering system includes a current sensor configured to be communicatively coupled to a conductor and first and second accumulators configured to receive samples from the current sensor and to separately accumulate values indicative of at least two of a total current flowing through the conductor, a current flowing through the conductor during a positive half-cycle, and a current flowing through the conductor during a negative half-cycle for a predetermined sample period of time. The system also includes a processor programmed to determine an imbalance between the current flowing through the conductor during a positive half-cycle and a current flowing through the conductor during a negative half-cycle using the accumulated values.

DETAILED DESCRIPTION

The following detailed description illustrates the disclosure by way of example and not by way of limitation. The description clearly enables one skilled in the art to make and use the disclosure, describes several embodiments, adaptations, variations, alternatives, and uses of the disclosure, including what is presently believed to be the best mode of carrying out the disclosure. The disclosure is described as applied to a preferred embodiment, namely, a systems and methods of detecting a DC influence in an electrical metering system. However, it is contemplated that this disclosure has general application to detecting metering anomalies in other than strictly power supply systems.

Figure 1:
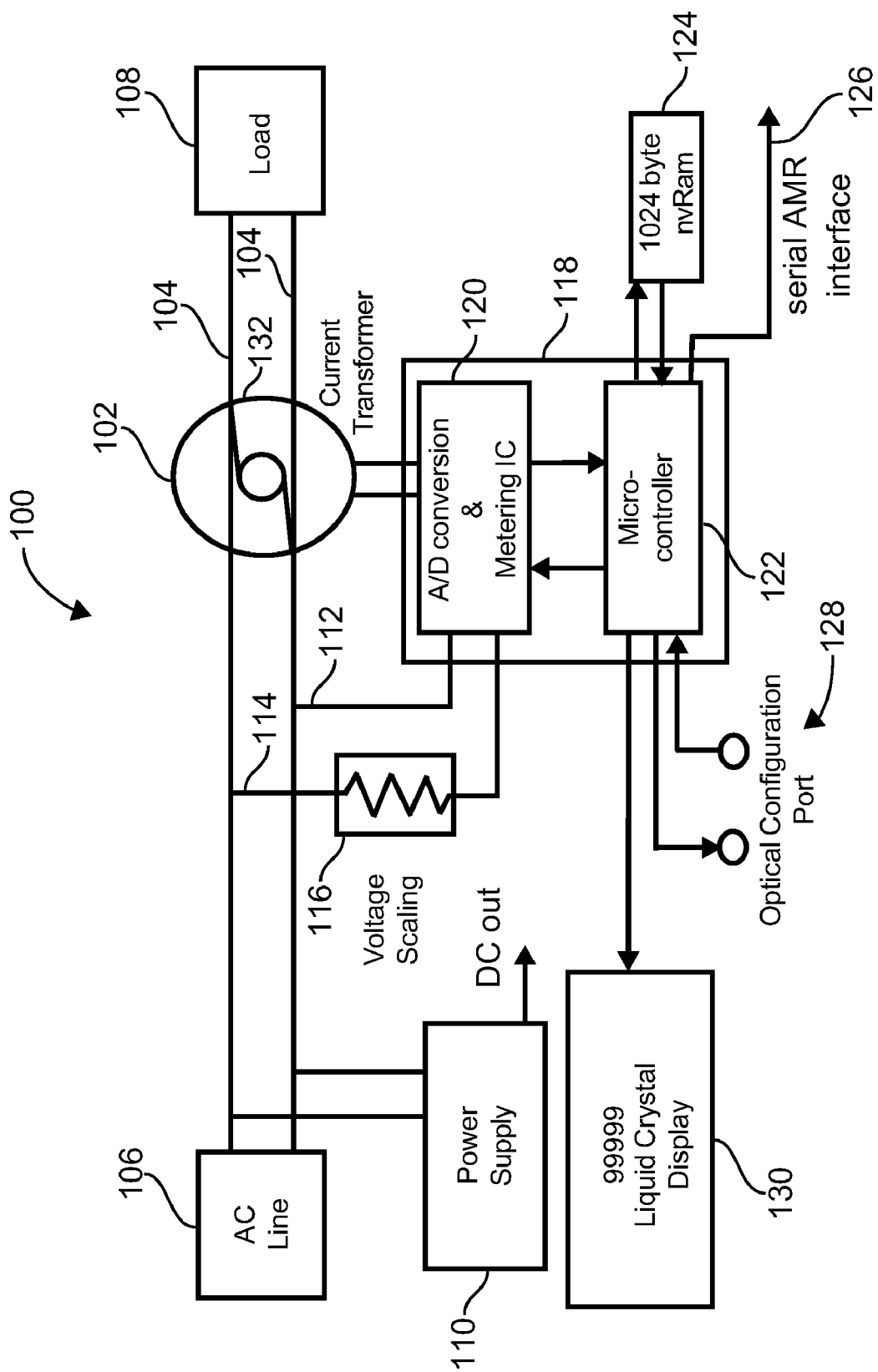
FIG. 1 is a block diagram of an exemplary electrical metering system in accordance with an embodiment of the present invention.

FIG. 1 is a block diagram of an exemplary electrical metering system 100 in accordance with an embodiment of the present invention. In the exemplary embodiment, metering system 100 includes a current transformer 102 configured to be magnetically coupled to a conductor 104 configured to carry electrical current from an electrical source 106 to a load 108. In various other embodiments, current transformer 102 may be embodied in any current sensor capable of performing the functions described herein. Current transformer 102 is configured to generate an electrical signal indicative of the current flow through conductor 104. In the exemplary embodiment, power for operating metering system 100 is supplied from conductors 104 through a power supply 110. A voltage signal indicative of the voltage across conductors 104 or on conductor 104 with respect to ground is received through a sensing tap 112 and a scaled sensing tap 114. A voltage scaling circuit 116 facilitates scaling the voltage values used in computations within metering system 100. A meter board 118 includes an A/D conversion and metering circuit 120 and a processor 122 such as a microcontroller. A/D conversion and metering circuit 120 receives signals from current transformer 102 and converts the received, generally analog, signals to digital signals that are usable by processor 122 and other processor that eventually process the signals.

Metering system 100 generally includes at least one processor that is programmed to perform the functions described herein. Processor, as used herein, is not limited to just those integrated circuits referred to in the art as a processors, but broadly refers to a computer, a microprocessor, a microcontroller, a programmable logic controller, an application specific integrated circuit, and another programmable circuit, and these terms are used interchangeably herein.

Metering system 100 includes a non-volatile RAM memory 124 communicatively coupled to processor 122. Processor 122 communicates to devices off-board metering system 100 using a serial interface 126 and an optical port 128. In the exemplary embodiment, metering system 100 displays output parameters via a liquid crystal display (LCD) 130.

In the exemplary embodiment, the output of current transformer 102 may be influenced by low frequency or DC magnetic fields proximate current transformer 102. For example, a rectified current, such as but not limited to baseboard heat or a hot water heater, may cause a core 132 of current transformer 102 to saturate, which would cause current transformer 102 to under report the current flowing through conductor 104. A rectified waveform includes 2nd and other even order harmonics, which cause an imbalance between the positive and negative half cycles of the current.

Figure 2:
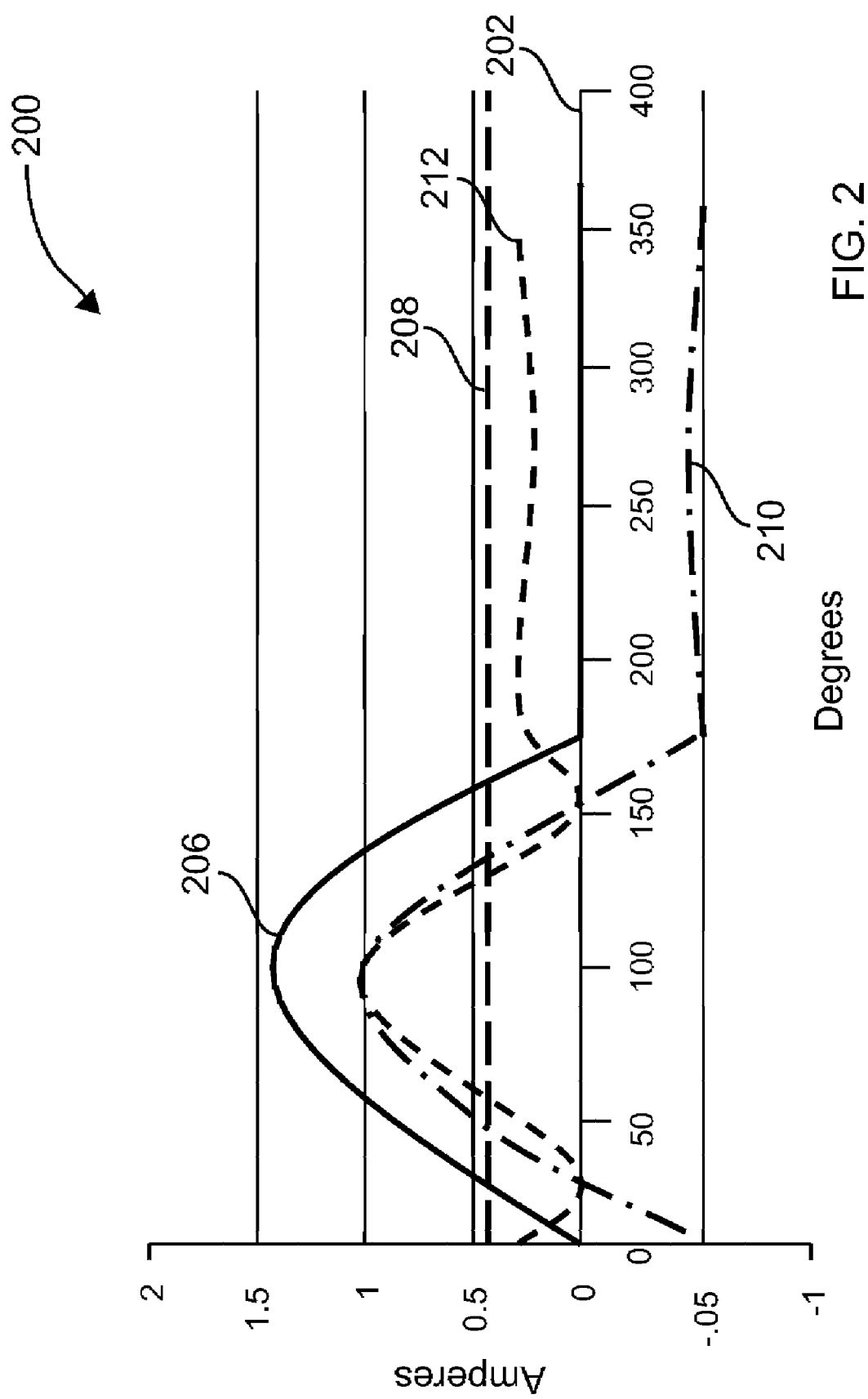
FIG. 2 is a graph of an exemplary half wave rectified sine wave current that may be received by the system shown in FIG. 1.

FIG. 2 is a graph 200 of an exemplary half wave rectified sine wave current that may be received by system 100 (shown in FIG. 1). In the exemplary embodiment, graph 200 includes an x-axis 202 graduated in units of degrees and a y-axis 204 graduated in units of Amperes. A trace 206 illustrates an approximate one Ampere half wave rectified current. A trace 208 illustrates a DC component of the current flowing through conductor 104. Although current transformer 102 does not pass the DC component to the secondary winding of current transformer 102, it does tend to saturate core 132. The DC component has a value about 45% of an original RMS current represented by trace 210. A trace 210 represents the AC component of the signal, a 60 Hz component about 71% of the original RMS current and an infinite series of even harmonics. The magnitude of the harmonics decays quite quickly with increasing harmonic number, the second and fourth having magnitudes of approximately 30.0% and 6.0% of the original RMS current, respectively. As can be seen in graph 200, trace 210 and trace 206 substantially match but are offset by the DC component, shown as trace 208. A trace 212 represents the current squared values of trace 210. An amount of imbalance between the current squared values of the RMS current during the positive and negative half cycles is indicative of the amount of DC component in the current.

Figure 3:
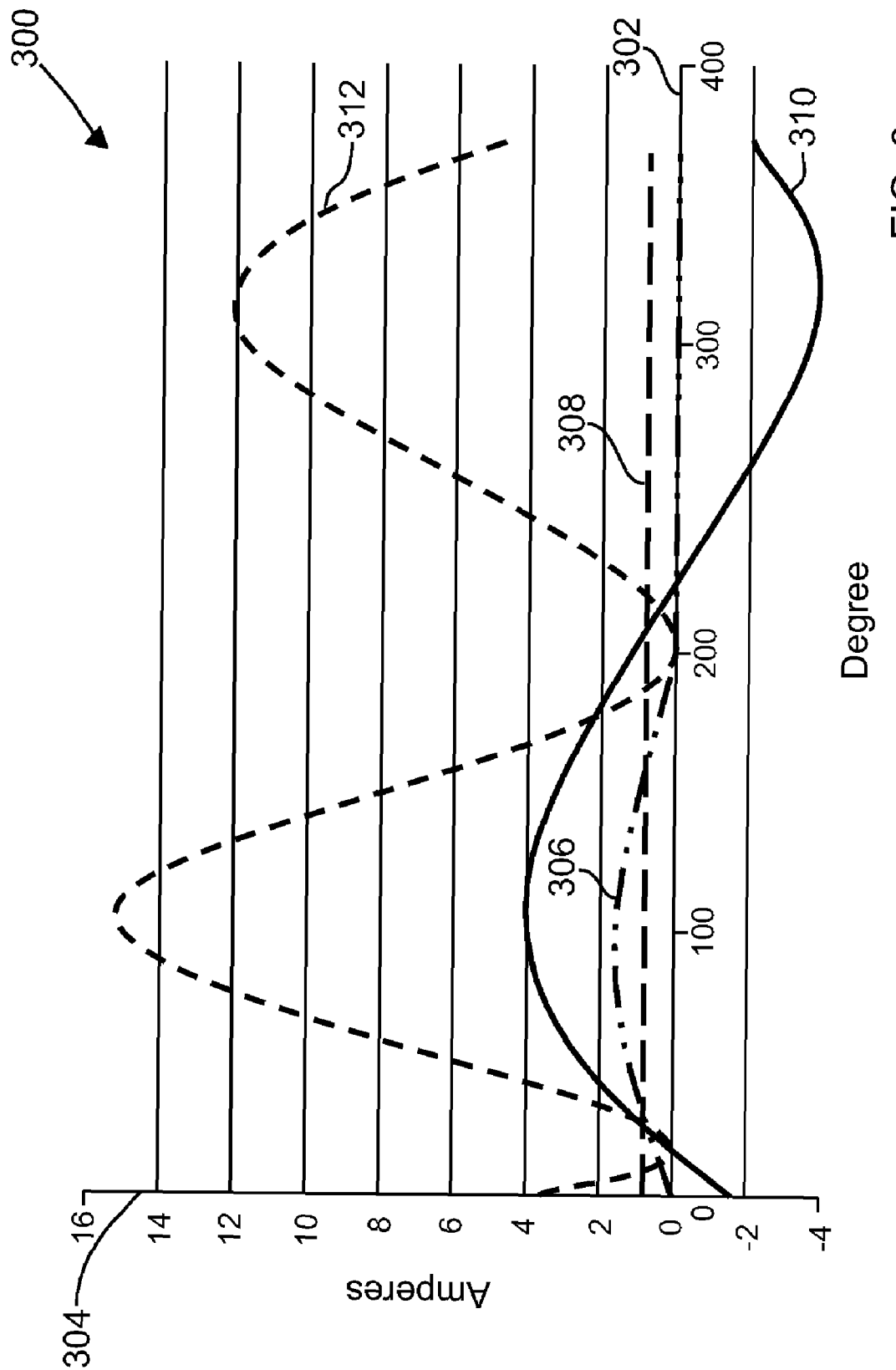
FIG. 3 is a graph of an exemplary load current trace for a one Ampere rectified load and a three Ampere normal load that may be received by the system shown in FIG. 1.

FIG. 3 is a graph 300 of an exemplary load current trace for a one Ampere rectified load and a three Ampere normal load that may be received by system 100 (shown in FIG. 1). In the exemplary embodiment, graph 300 includes an x-axis 302 graduated in units of degrees and a y-axis 304 graduated in units of Amperes. A trace 306 illustrates an approximate one Ampere half wave rectified current. A trace 308 illustrates a DC component of the current flowing through conductor 104. A trace 310 represents the AC component of the signal of approximately three Amperes and the AC component of the rectified signal. Trace 310 lags trace 306 by approximately thirty degrees. A trace 312 represents the current squared values of trace 310. An amount of imbalance between the current squared values of the RMS current is indicative of the amount of DC component in the current.

Figure 4:
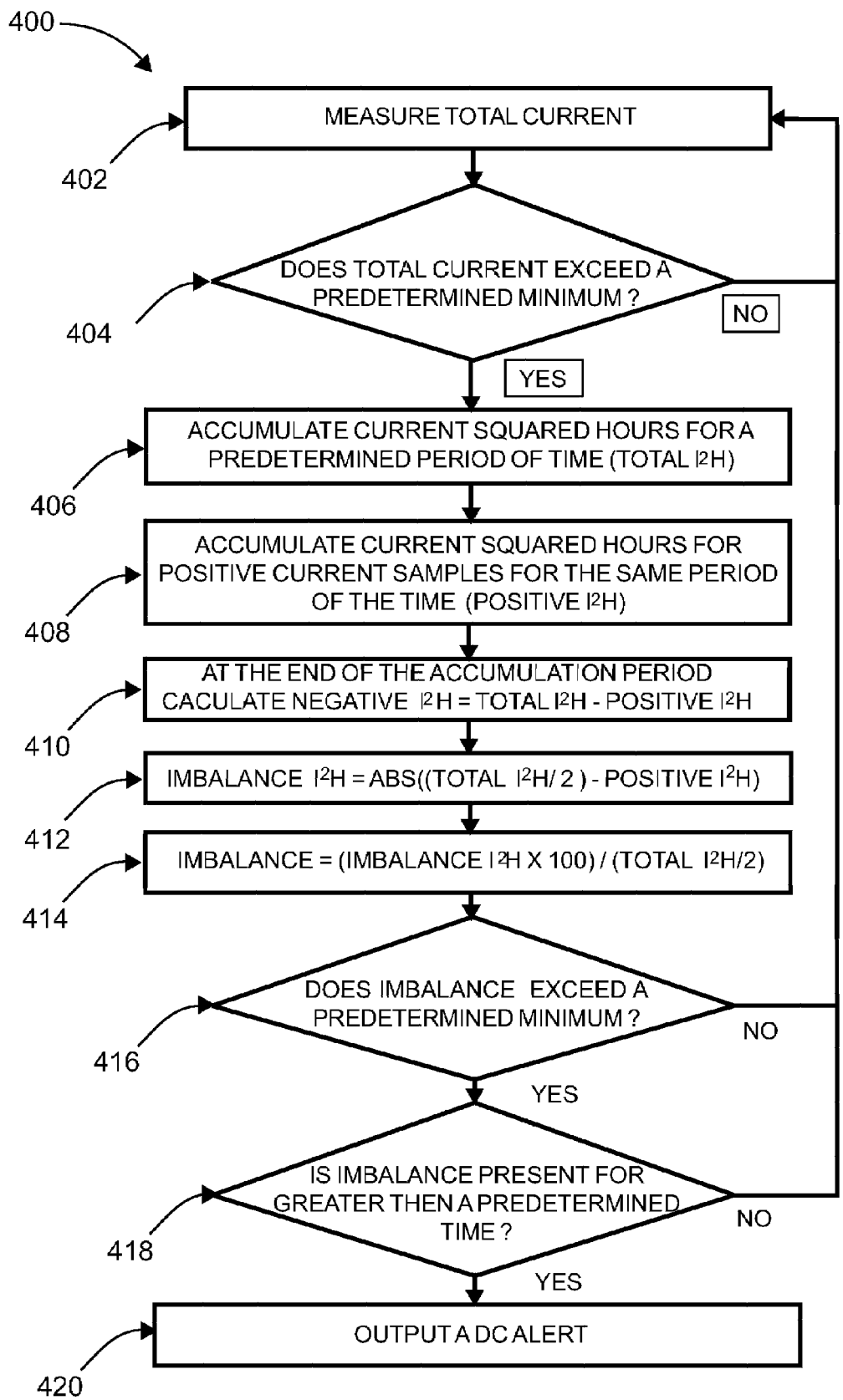
FIG. 4 is a flow chart of an exemplary method of detecting a DC influence in a current detector in accordance with an embodiment of the present invention.

FIG. 4 is a flow chart of an exemplary method 400 of detecting a DC influence in a current detector in accordance with an embodiment of the present invention. Method 400 includes measuring 402 the total current and determining 404 if the total current is greater than a predetermined minimum current. To facilitate reducing false positive reports of DC influence affecting the output of metering system 100, method 400 includes several tests, including step 404 to determine whether the influence is due to a relatively short transient or a change in the load characteristics that may affect the revenue-based output of metering system 100. If current is greater than the predetermined threshold, method 400 accumulates 406 current squared hours for a predetermined period of time (Total $I^2h$) and accumulates 408 current squared hours for positive current samples for the same period of time (Positive $I^2h$). In an alternative embodiment, accumulates current squared hours for negative current samples for the same period of time (Negative $I^2h$). In yet another alternative embodiment, accumulates current squared hours for the positive half cycles of the voltage waveform. An algorithm determines current imbalance between the positive and negative half cycles of a full wave of current flow. In one embodiment, the imbalance is determined using the total current squared hours and the positive half cycle current squared hours. In other embodiments total current squared hours and the negative half cycle current squared hours are used. In still further embodiments, the positive half cycle current squared hours and the negative half cycle current squared hours are used. There is a memory savings in accumulating two of the three current squared hours terms and calculating the third. However, all three current squared hours terms may be accumulated.

At the end of the accumulation period, negative current squared hours is determined 410 using:

$$I^2h_N = I^2h_T - I^2h_P. \quad (1)$$

An imbalance current squared hours is determined 412 using at least one of:

$$\text{Imbalance } I^2h = ABS((I^2h_T/2) - I^2h_P), \text{ and} \quad (2)$$

$$\text{Imbalance } I^2h = ABS(((I^2h_N + I^2h_P)/2) - I^2h_P). \quad (3)$$

Because $I^2h_T = I^2h_N + I^2h_P$, equations (2) and (3) are equaivalent however an equation in the form of equation (2) is simpler to calculate using for example, an 8-bit processor.

An imbalance is determined 414 using:

$$\text{Imbalance} = (\text{Imbalance } I^2h \times 100)/(I^2h_T/2). \quad (4)$$

Method 400 includes determining 416 whether the magnitude of the Imbalance exceeds a predetermined minimum. If yes, method 400 advances to determining 418 whether the Imbalance is present for a time greater than a predetermined minimum time. If yes, a DC imbalance condition is alerted 420. The alert may be displayed, stored, or transmitted to an operator or central office for further corrective action. Additionally, each Imbalance determination may be accumulated and the time that an imbalance is present may also be accumulated. Such information may facilitate setting the selectable thresholds used to determine if the Imbalance is false or not. Such information may also be used to facilitate determining problems in the downstream electrical loads or upstream in the electrical supply.

As will be appreciated by one skilled in the art and based on the foregoing specification, the above-described embodiments of the disclosure may be implemented using computer programming or engineering techniques including computer software, firmware, hardware or any combination or subset thereof, wherein the technical effect is detecting DC influence in a current sensor coupled to a metering system to facilitate accurate revenue metering of electrical power delivered to a load. Any such resulting program, having computer-readable code means, may be embodied or provided within one or more computer-readable media, thereby making a computer program product, i.e., an article of manufacture, according to the discussed embodiments of the disclosure. The computer readable media may be, for example, but is not limited to, a fixed (hard) drive, diskette, optical disk, magnetic tape, semiconductor memory such as read-only memory (ROM), and/or any transmitting/receiving medium such as the Internet or other communication network or link. The article of manufacture containing the computer code may be made and/or used by executing the code directly from one medium, by copying the code from one medium to another medium, or by transmitting the code over a network.

The above-described methods and systems for detecting DC influence in a current sensor are cost-effective and highly reliable. The methods and systems include determining an imbalance between a current signal from positive and negative half cycles to detect a DC component of the current. Accordingly, the methods and systems facilitate operating power sources in a cost-effective and reliable manner.

While embodiments of the disclosure have been described in terms of various specific embodiments, those skilled in the art will recognize that the embodiments of the disclosure can be practiced with modification within the spirit and scope of the claims.

What is claimed is:

1. A method of detecting a DC influence of a current sensor, said method comprising: determining a total RMS current from the sensor over a predetermined period of time; determining at least one of an RMS current of a positive half cycle and an RMS current of a negative half cycle over the predetermined period of time; determining an imbalance of the RMS current of the positive half cycle and the RMS current of the negative half cycle using at least two of the total RMS current, the RMS current of the positive half cycle, and the RMS current of the negative half cycle; and outputting an indication of the imbalance.

2. A method in accordance with claim 1 further comprising calculating the imbalance when a current flow through the conductor is greater than a predetermined threshold.

3. A method in accordance with claim 1 further comprising determining at least one of the total current squared hours ($I^2h_T$) flowing through the conductor using the total RMS current, the current squared hours ($I^2h_P$) flowing through the conductor during the positive half-cycle using the RMS current of a positive half cycle, and the current squared hours ($I^2h_N$) flowing through the conductor during the negative half-cycle using the RMS current of a negative half cycle.

4. A method in accordance with claim 3 wherein said processor is programmed to determine an imbalance current squared hours ($I^2h$) using:

Imbalance $I^2h = ABS((I^2h_T/2) - I^2h_P)$.

5. A method in accordance with claim 4 wherein said processor is programmed to determine an imbalance using:

Imbalance = (Imbalance $I^2h \times 100)/(I^2h_T/2)$.

6. A method in accordance with claim 5 wherein said processor is programmed to generate an alert output when the imbalance exceeds a predetermined threshold for a predetermined period of time.

7. A method of detecting a current imbalance in a current sensor, said method comprising: measuring a total current supplied to a load; if the total current is greater than a predetermined minimum current threshold for greater than a first predetermined period of time, determining a current imbalance in the current sensor by: accumulating a plurality of current samples that represents a total RMS current from the sensor over a second predetermined period of time; determining from the accumulated samples at least one of an RMS current of a positive half cycle and an RMS current of a negative half cycle over the predetermined period of time; determining an imbalance of the RMS current of the positive half cycle and the RMS current of the negative half cycle using at least two of the total RMS current, the RMS current of the positive half cycle, and the RMS current of the negative half cycle; and outputting an indication of the imbalance.

8. A method of detecting a current imbalance, said method comprising:
   accumulating total current squared hours for a predetermined period of time from a plurality of samples of a current flowing through a conductor;
   accumulating current squared hours for at least one of positive current samples and negative current samples of the plurality of samples for the period of time;
   determining a current imbalance between the positive current samples and negative current samples using at least two of the total current squared hours, the positive current squared hours, and the negative current squared hours; and
   outputting an indication of the detected current imbalance.

9. A method of detecting a current imbalance in accordance with claim 8 further comprising:
   determining if a magnitude of the detected current imbalance exceeds a predetermined minimum threshold;
   if the magnitude of the detected current imbalance exceeds the predetermined minimum threshold, determining if the detected current imbalance is present for a time period that is greater than a predetermined minimum time period; and
   if the detected current imbalance is present for a time period that is greater than the predetermined minimum time period, outputting an alert of the detected imbalance condition.

10. A method of detecting a current imbalance in accordance with claim 8 further comprising accumulating the total time period each of the detected current imbalances exceed the predetermined minimum threshold.

11. A method of detecting a current imbalance in accordance with claim 10 further comprising determining that a detected current imbalance is a false detected current imbalance using at least one of the accumulating the total time period, the magnitude of the detected current imbalance, and the time period the detected current imbalance is greater than the predetermined minimum time period.

* * * * *